United States Patent [19]
Banakis et al.

[11] Patent Number: 5,504,994
[45] Date of Patent: Apr. 9, 1996

[54] METHOD OF FABRICATING A RECEPTACLE CONNECTOR FOR AN IC CARD

[75] Inventors: Emanuel G. Banakis, Naperville; Kenneth F. Janota, Lisle; Harold K. Lang, Fox River Grove, all of Ill.

[73] Assignee: Molex Incorporated, Lisle, Ill.

[21] Appl. No.: 230,680

[22] Filed: Apr. 21, 1994

[51] Int. Cl.[6] ............................................. H01R 43/16
[52] U.S. Cl. ........................... 29/884; 439/79; 439/629
[58] Field of Search ................. 29/876, 884; 439/279, 439/629, 630

[56] References Cited

U.S. PATENT DOCUMENTS

| | | | |
|---|---|---|---|
| 4,380,119 | 4/1983 | Normann | 439/79 X |
| 4,586,772 | 5/1986 | Cobaugh et al. | 439/629 X |
| 4,635,354 | 1/1987 | Chrobak et al. | 29/622 |
| 4,734,042 | 3/1988 | Martens et al. | 439/79 X |
| 4,812,129 | 3/1989 | Rofer et al. | 439/79 |
| 4,932,885 | 6/1990 | Scholz | 439/630 X |
| 4,997,376 | 3/1991 | Buck et al. | 439/59 |
| 5,141,445 | 8/1992 | Little | 439/79 X |
| 5,342,208 | 8/1994 | Kobayashi et al. | 439/79 |

FOREIGN PATENT DOCUMENTS

| | | | |
|---|---|---|---|
| 3-222273 | 10/1991 | Japan | 439/629 |
| 4132181 | 5/1992 | Japan | H01R 23/68 |

OTHER PUBLICATIONS

AMP Catalog 65701, p. 8, Revised Nov. 1993, Memory Card/PC Card Connectors.
Methode Catalog Page, Memory Card Socket Connector.
Elco/Kyocera Catalog Page, Figure 7 Memory Card Connector Assembly.
Maxtor Drawing No. 004802103, Rev. P11, Sheet 2 of 2.

Primary Examiner—Carl J. Arbes
Attorney, Agent, or Firm—Stacy E. Caldwell

[57] ABSTRACT

A method is provided for fabricating a receptacle connector for use in an IC card assembly wherein the receptacle connector is adapted for mounting generally at an edge of a circuit substrate. A housing is provided with an upper surface and a plurality of terminal-receiving passages in a dual row configuration extend parallel to the upper surface. The circuit substrate is adapted to be located a given vertical distance from the upper surface of the housing. A plurality of receptacle terminals are inserted into the passages with surface mount tail portions of the terminals projecting outside the passages. The vertical distance between the circuit substrate and the top of the housing is determined. The tail portions of the two rows of terminals initially project in a generally straight planar array from a rear face of the housing. In a single final forming step, the surface mount tail portions are formed into coplanar curved contact portions such that the contact portions of the surface mount tail portions will engage a corresponding single row contact pad array on the edge of the circuit substrate when the receptacle connector is mounted generally thereon.

5 Claims, 5 Drawing Sheets

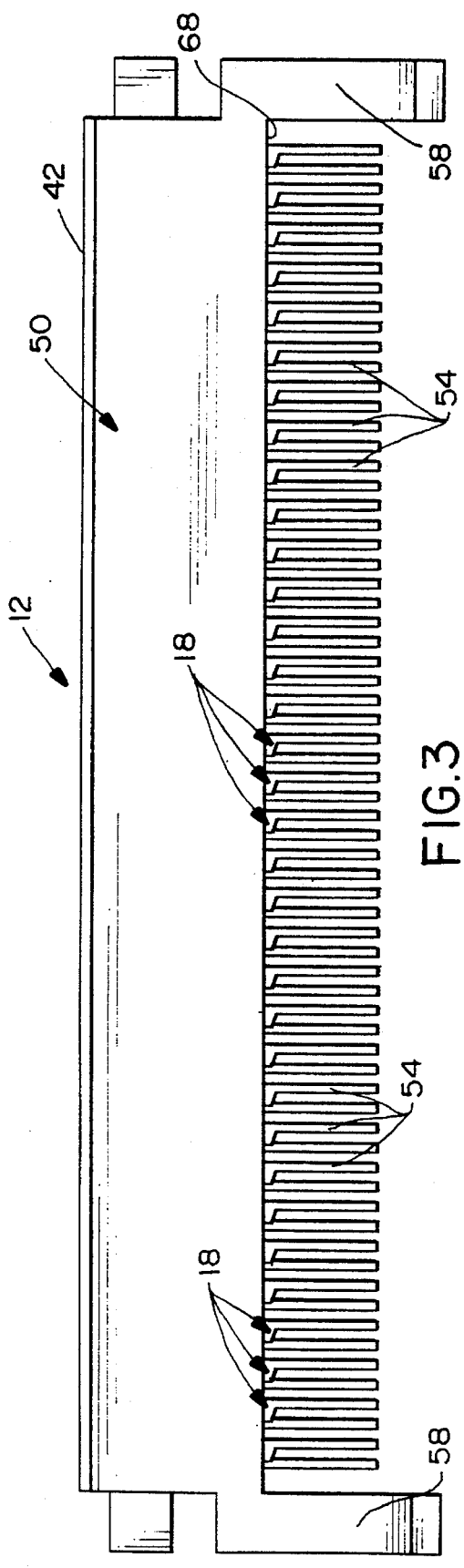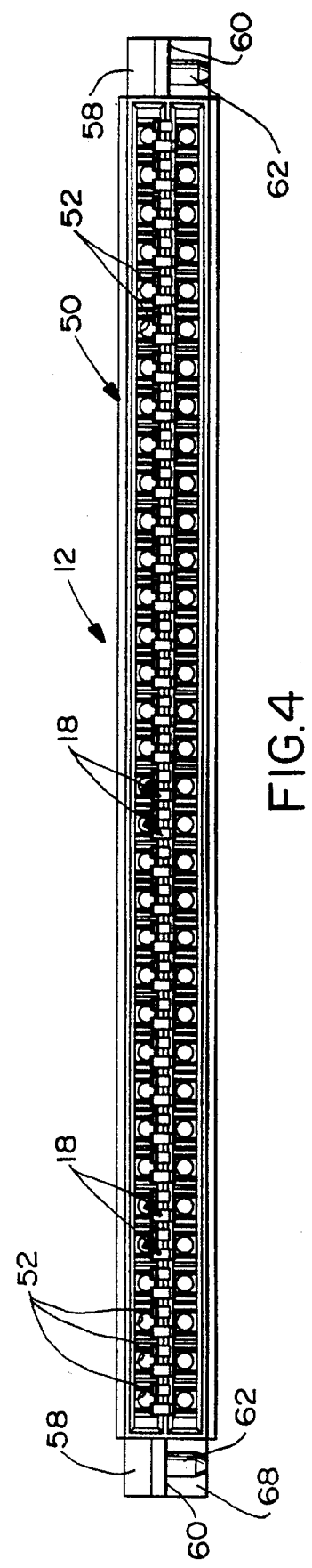

METHOD OF FABRICATING A RECEPTACLE CONNECTOR FOR AN IC CARD

FIELD OF THE INVENTION

This invention generally relates to the art of IC cards and, particularly, to a method of fabricating a receptacle connector for use in an IC card.

BACKGROUND OF THE INVENTION

Generally, IC cards or packs, such as memory cards, are data input devices which are electrically connected to an electronic apparatus or storage device, such as a word processor, personal computer or other electronic apparatus. The data stored in the IC card is transferred to the electronic apparatus. IC cards are portable instruments which are readily inserted and extracted from a connector for removably coupling the IC card to a printed circuit board, for instance.

An IC card may include a frame which usually is generally rectangular and includes an opening in either a top surface or a bottom surface thereof or, in some constructions, in both surfaces. The opening receives a circuit substrate, and a panel or cover closes the opening and encloses the circuit substrate within the frame. In other IC cards, a separate frame is not used, and the circuit substrate simply is sandwiched between a pair of cover panels. This assembly is held together by an adhesive material The circuit substrate of an IC card conventionally is a generally planar construction around which the pair of cover panels are assembled. In addition to a receptacle connector, electrical components including semi-conductor devices, integrated circuits, batteries or the like are mounted to the circuit substrate and extend a given distance or height off the circuit substrate in one or both directions. Therefore, the circuit substrate is "offset" toward the top or bottom cover to accommodate the maximum height of such electrical components. Depending on the type of components used, different offsets may be required for different applications, and therefore, the circuit substrate is located at varying heights within the card.

The receptacle connector typically includes a housing having receptacle terminals mounted therein. The connector has a mating face for mating to a header connector of an underlying electronic apparatus, and a rear face opposite the mating face, from which extends surface mount tails of the receptacle terminals for engaging corresponding areas on the circuit substrate. Accordingly, the surface mount terminal tails of the receptacle connector must be formed to the surface of the circuit substrate in each application having a different offset inasmuch as the mating face of the receptacle connector is generally of a fixed configuration according to such standards as the Personal Computer Memory Card International Association ("PCMCIA").

Considerations when forming the surface mount terminal tails to the surface of the substrate include whether the surface mount terminal array of the receptacle connector is single row or dual row, whether the corresponding circuit substrate contact area or contact array is single row or dual row, and whether the surface mount terminal tails in each row are offset laterally from one another. In the case of dual row receptacle connectors, where the terminal array of the receptacle connector is "straddle mount", the surface mount terminal tails are not terminated in a common plane, rather, they "straddle" the circuit substrate. Where the surface mount terminal tails make contact with a dual row circuit substrate contact array, the surface mount terminal tails will terminate in a common plane, however, the upper and lower rows of terminals, by necessity, must be formed separately. In the case of a dual row receptacle connector which makes contact with a single row circuit substrate array, the surface mount terminal tails must terminate in-line to a common plane on a surface of the circuit substrate.

The forming of the surface mount terminal tails of a dual row receptacle connector for different offsets in varying applications may occur at any step in the assembly process. Typically, the required offset is determined in advance of the assembly of the receptacle connector, and, as such, the surface mount tails of the terminals may be formed within the terminal die prior to inserting them into the receptacle connector housing. According to the offset required, preformed terminals are then inserted into the two rows of the receptacle connector housing to produce two rows of surface mount tails which all contact the surface of the circuit substrate in a common plane. The upper and lower rows of tails must be formed separately to produce a connector assembly in which the tails lie within a single row of a common plane. Such a method necessarily requires separate forming dies or complicated die forming inserts within a single terminal die which is costly in terms of design, maintenance, and inventory. Furthermore, the different variations of the terminals prior to connector assembly necessitate different inserts or tracks within the assembly machine and/or different carriage and packaging containers to accommodate each version prior to assembly. In view of such requirements, different part numbers and/or inventory must be created to track and store the different terminals, differing assembly machine inserts and/or sequences, and different packaging requirements.

An alternative to forming the terminals to the required offset in the terminal die is to form them in the assembly machine after insertion of the terminals into the housing. Since the two different rows of terminal tails will undergo a distinctly different sequence of forms in order to result in a single row coplanar array, the assembly machine must have a first set of forming stations dedicated to the forming sequence needed for the "lower" row of tails, and a second set of forming stations dedicated to the (different) forming sequence needed for the "upper" row. When another offset is subsequently required, the forming locations and angles for each of the forming stations for each of the two connector terminal rows must be changed. This severely complicates the assembly machine and accordingly adds to the cost, design and maintenance thereof, since a large degree of flexibility of possible operations must be designed and built into the machine initially, notwithstanding the cost of the change tooling required for each additional offset. The shop labor time required to make the actual tool changes themselves during production represents still another cost.

Both methods of producing connector assemblies having differing offsets thus requires complicated inventory and changes in machinery. Such requirements of inventory and changes in machinery become very costly and time consuming. Therefore, each deviation from a given offset requires extensive and expensive changes in the assembly machines, terminal dies, and other associated tools, and processes.

SUMMARY OF THE INVENTION

An object, therefore, of the invention is to provide a new and improved method of fabricating a receptacle connector for use in an IC card wherein the receptacle connector is mounted generally at an edge of a circuit substrate, and wherein the circuit substrate is offset a given distance from at least one of the top or the bottom of the IC card.

The method includes the steps of providing a receptacle connector housing with an upper surface and a plurality of terminal receiving passages in a dual row configuration extending parallel thereto. A plurality of receptacle terminals are inserted into the passages with two rows of surface mount tail portions of the terminals projecting from the passages and adapted for engaging a corresponding single row circuit array on the circuit substrate. The vertical distance between the circuit substrate and the upper surface of the connector housing is determined. The surface mount tail portions of the terminals in the bottom row of passages is formed up to the surface mount tail portions of the terminals in the top row of passages so that both rows of surface mount tail portions initially exit the housing in a single coplanar array, projecting from the passages in a generally straight configuration. The final forming step, performed after insertion of the receptacle terminals, includes simultaneously forming the straight tail portions into curved contact portions to accommodate the determined given distance such that the tail portions will engage the corresponding circuit array on the upper surface of the circuit substrate when the receptacle connector is mounted generally at the edge of the circuit substrate with the circuit substrate offset at said given distance.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

FIG. 3 is a top plan view of the receptacle connector;

FIG. 4 is an elevational view of the rear or terminating side of the receptacle connector;

DETAILED DESCRIPTION OF THE PREFERRED EMBODIMENT

Figure 1:
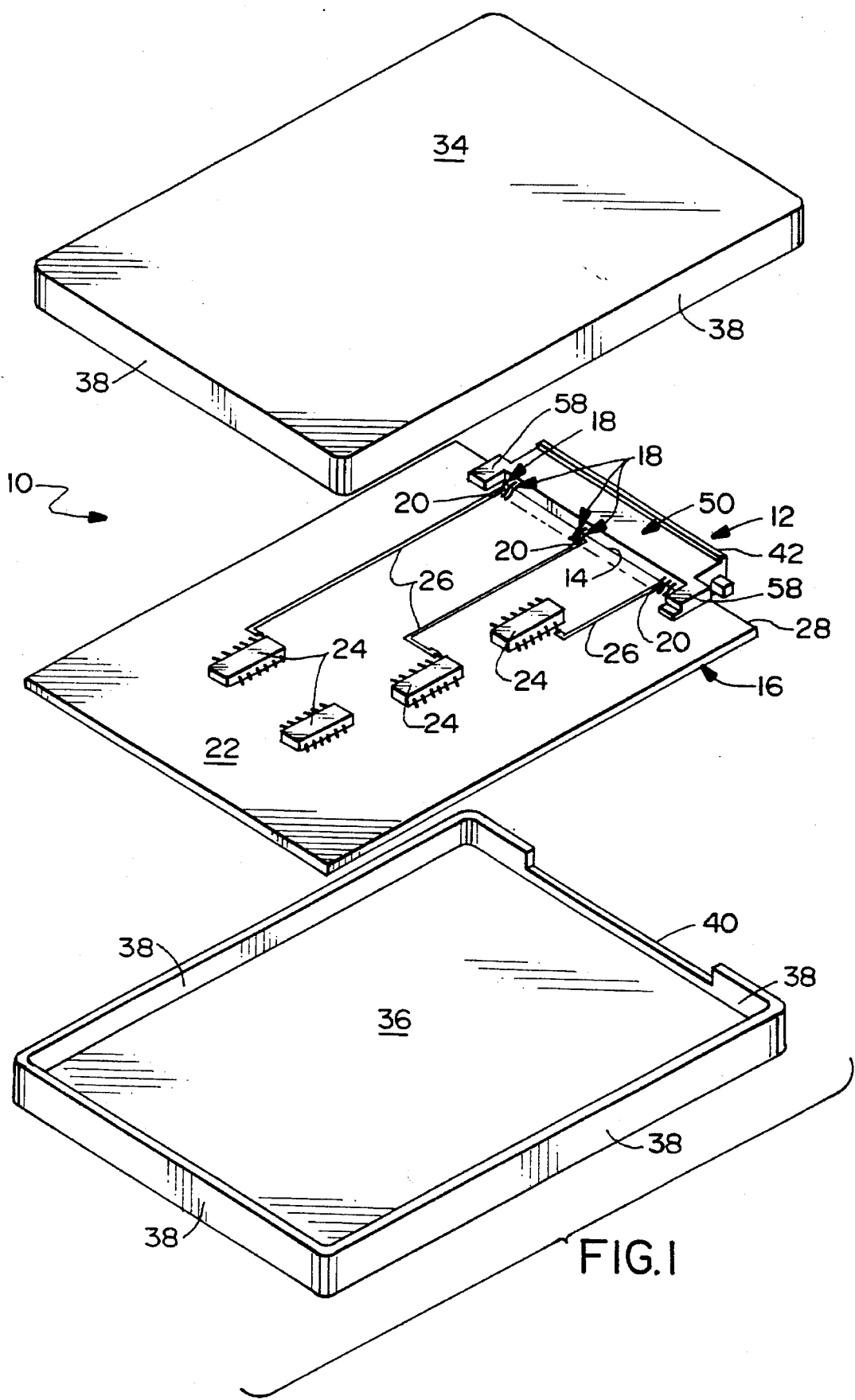
FIG. 1 is an exploded perspective view of an IC card including a receptacle connector fabricated according to the method of the invention.

Referring to the drawings in greater detail, and first to FIG. 1, the invention is embodied in an IC card assembly, generally designated 10, which is provided as a data input device, such as a memory card, for connection to an electronic apparatus or storage device, such as a word processor, personal computer or other electronic apparatus (not shown). The data stored in memory card 10 is transferred to the electronic apparatus through the terminals within an elongated receptacle connector 12 which is edge mounted to an area 14 on a circuit substrate or circuit board, generally designated 16.

Receptacle connector 12 is elongated and mounts a plurality of receptacle input terminals, generally designated 18. The terminals mechanically and electrically engage contact pads 20 printed or otherwise disposed in a single-row array on a surface 22 of circuit substrate 16. Various electrical components or circuit elements 24 are surface mounted on surface 22, along with circuit traces 26 leading to contact pads 20 at the leading or front edge 28 of the substrate. This edge is coupled to elongate receptacle connector 12, and the receptacle connector is interconnectable with an electrical connector apparatus, such as a header connector on a printed circuit board of the underlying electronic apparatus to which data stored in circuit substrate 16 is transferrable.

The above description of circuit substrate 16 is generally conventional, and, consequently, the depiction of the circuit substrate is not in the utmost detail. However, it should be understood that electrical components or circuit elements 24 may comprise semi-conductor devices, batteries, and other parts of integrated circuits from which stored data is transferred to the electronic apparatus.

Still referring to FIG. 1, IC card assembly 10 includes a pair of cover panels 34 and 36 which sandwich circuit substrate 16 therebetween. The panels may have peripheral flanges 38 which space the panels from circuit substrate 16, along with open areas 40 at the front of the panels for accommodating elongated receptacle connector 12, leaving at least a mating face 42 of the receptacle connector exposed for connection to the appropriate mating electronic apparatus, a header connector for the apparatus or the like.

Figure 2:
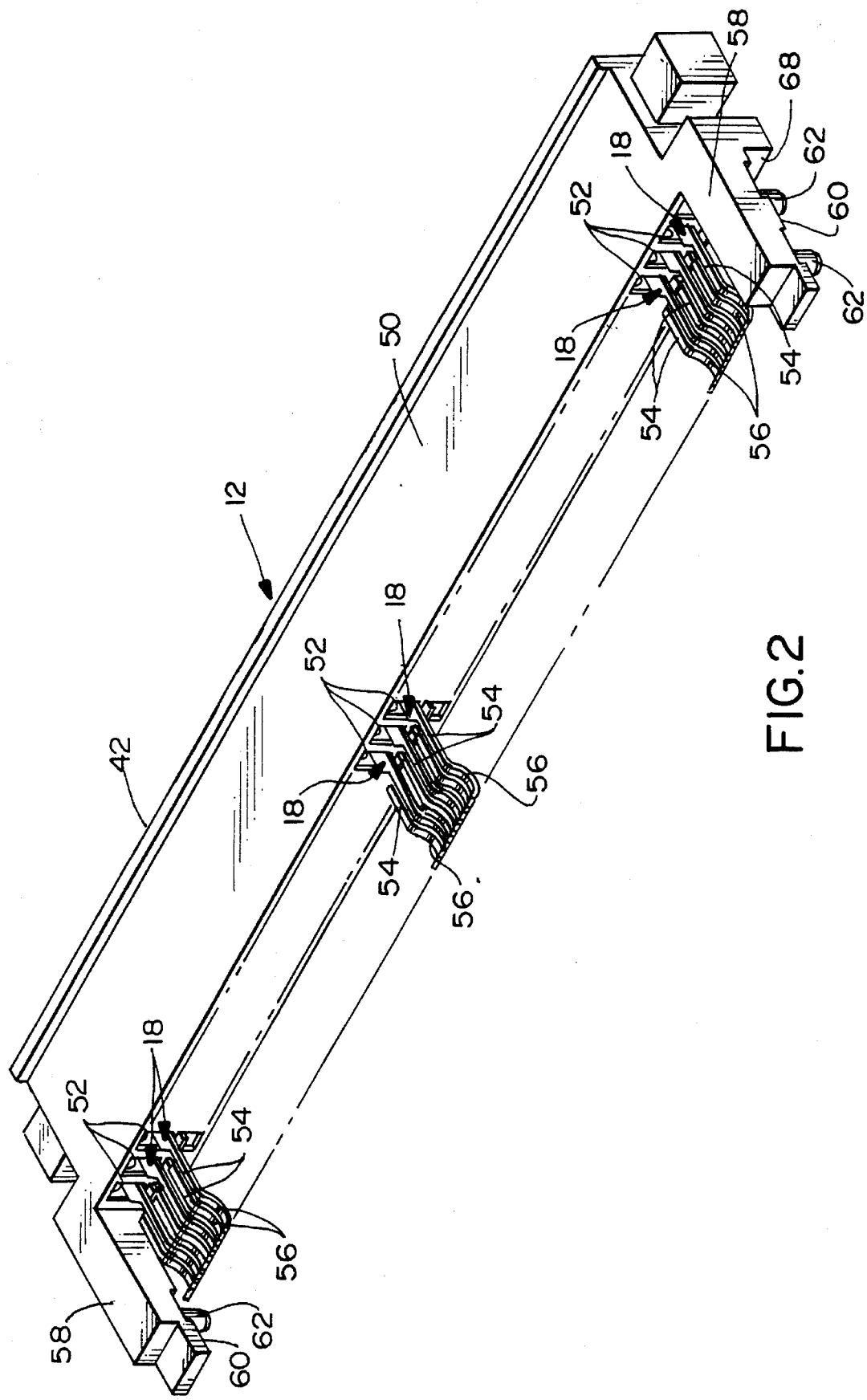
FIG. 2 is a perspective view, on an enlarged scale, of the rear or terminating side of the receptacle connector.

Referring to FIGS. 2–4, receptacle connector 12 includes a housing, generally designated 50, which, according to the invention, is provided with a plurality of terminal-receiving passages 52 in a dual row configuration. Terminals 18 are received in the passages, with two rows of surface mount tail portions 54 of the terminals projecting from the passages after the terminals are inserted into the passages. According to the method of the invention, the surface mount tail portions are simultaneously formed with curved contact portions 56 for engaging the single row array of contact pads 20 on surface 22 of circuit substrate 16.

Housing 50 of elongated receptacle connector 12 has a pair of end wing portions 58 with bottom surfaces 60 (FIG. 2). These surfaces engage surface 22 of circuit substrate 16. One or more mounting pegs 62 depend from wing portions 58 for insertion into appropriate mounting holes (not shown) in the circuit substrate.

Figure 5:
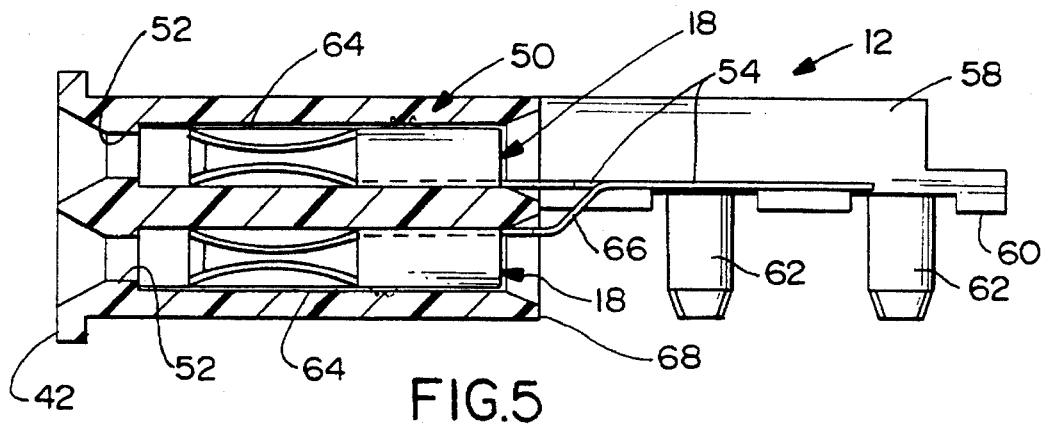
FIG. 5 is a vertical section through the receptacle connector prior to forming the tail portions of the terminals.

Referring to FIG. 5, it can be seen that receptacle terminals 18 are inserted into terminal-receiving passages 52 of receptacle connector housing 50 in two rows. Due to the staggered configuration of the surface mount tail portions, shown most clearly in FIGS. 2–4, the receptacle terminals in the upper row are identical to the terminals in the lower row, the terminals of the upper row are merely inserted in a mirror image configuration with respect to those of the lower row. The terminals have mating portions 64 which are located in the passages, and which are adapted to receive pins of a mating header connector or the like (not shown). Initially, tail portions 54 of the terminals project rearwardly from the passages in a generally straight coplanar configuration, that is, prior to finally forming the curved contact portions 56 described above in relation to FIG. 2. It can be seen in FIG. 5 that the tail portions of the lower terminals are formed with an offset 66 so that the tail portions of the terminals in both rows are coplanar lengthwise of the connector housing. When receptacle connector 12 is mounted to the circuit substrate, a rear face 68 of connector housing 50 will abut against edge 28 of the substrate while bottom surfaces 60 of wing portions 58 of the housing engage surface 22 of the substrate. With this understanding, it can be seen in FIG. 5 that surface mount tail portions 54 of the terminals are not yet finally formed for engaging the contact pads on the circuit substrate.

Figure 6A:
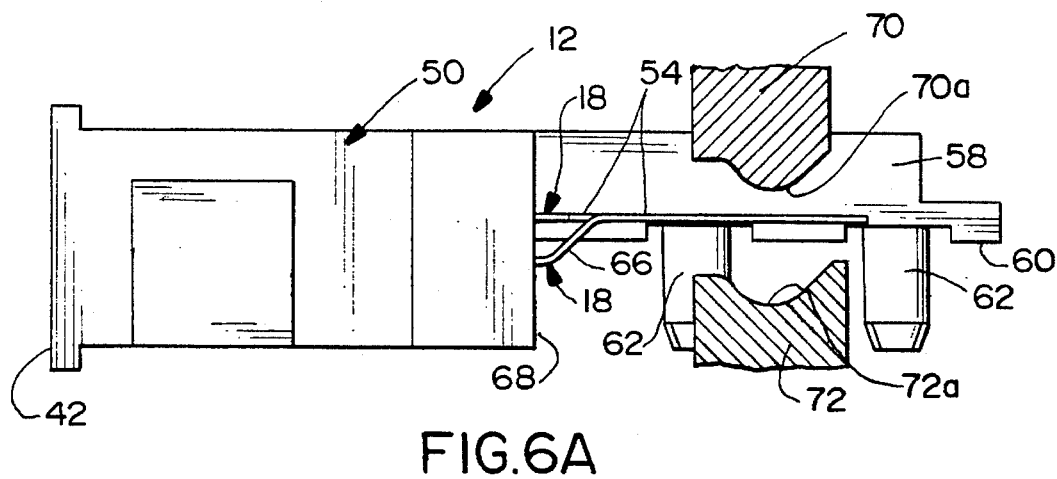
FIGS. 6A and 6B show sequential views in the method of forming the tail portions of the terminals.
Figure 6B:
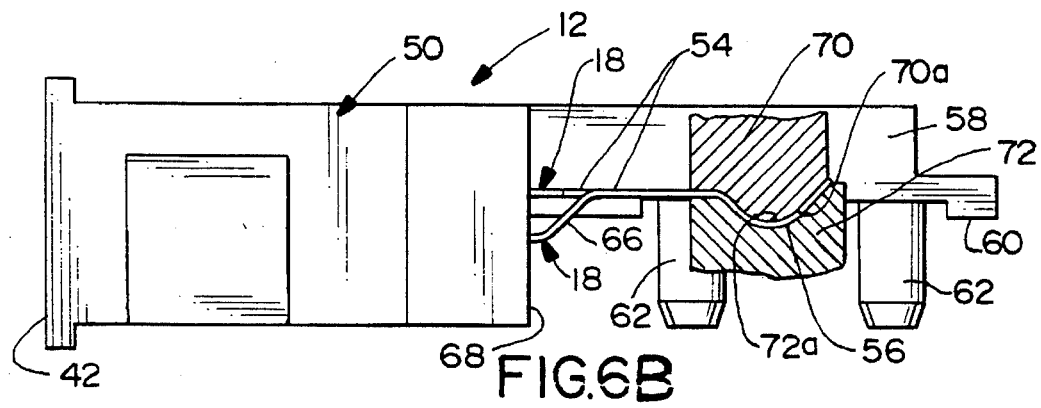

FIGS. 6A and 6B show how curved contact portions 56 of surface mount tail portions 54 are formed. Specifically, FIG. 6A show a pair of mating forming die parts 70 and 72 in inoperative or spread-apart condition. The upper die has a convex forming surface 70a, and the lower die has a concave forming surface 72a which are, together, effective to form the straight surface mount tail portions 54 (FIG. 6B) into a desired arcuate or curved configuration when the dies are closed as shown in FIG. 6B. In other words, FIG. 6A shows the tail portions in their straight in-line configuration after having been inserted into the terminal receiving passageways of connector housing 50 as described above in relation to FIG. 5. As stated above, the straight surface mount tail portions of both rows are in a single in-line coplanar array. Dies 70 and 72 are elongated in the direction of elongation of the receptacle connector and, when the dies are closed to form curved contact portions 56, the surface mount tail portions of the terminals are simultaneously formed whereby the resulting curved contact portions 56 are in position for engaging the corresponding single row array of contact pads on surface 22 of the circuit substrate.

Before the surface mount tail portions of the terminals are formed into curved contact portions 56, a determination is made of the given location where the circuit substrate and, thereby, the array of contact pads thereon must be relative to the IC card assembly to accommodate the card components or circuit elements. As stated above, circuit elements 24 may extend different distances or heights off of the circuit substrate in one or both directions. Therefore, the circuit substrate must be "offset" from the top or bottom surface of the IC card assembly or positioned within the IC card assembly to accommodate the maximum height of such electrical components. Depending on the type of components used, different offsets or locations may be required for different applications. Therefore, the invention contemplates that contact portions 56 of the surface mount tail portions be simultaneously formed, for a given application, i.e. substrate location, after insertion of the receptacle terminals into the terminal receiving passageways of the housing to accommodate a given offset distance.

Figure 7A:
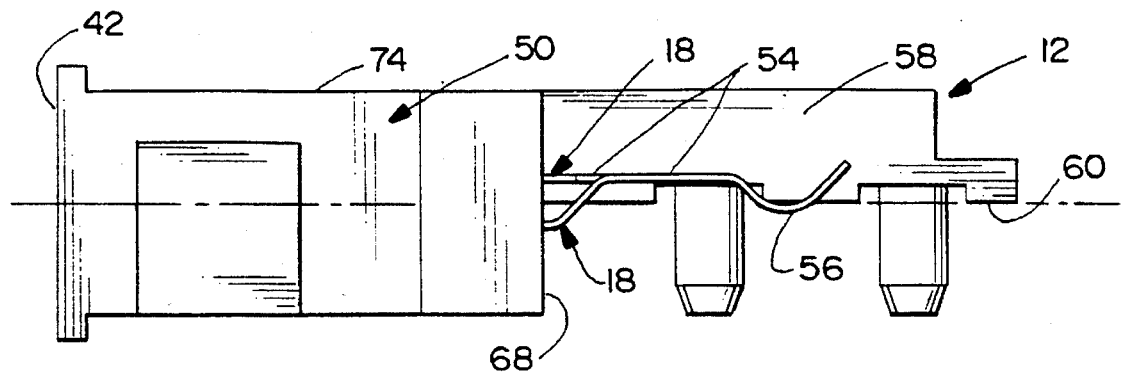
FIGS. 7A–7C show different configurations of the tail portions of the terminals, after forming, to accommodate circuit substrates having different offset distances.
Figure 7B:
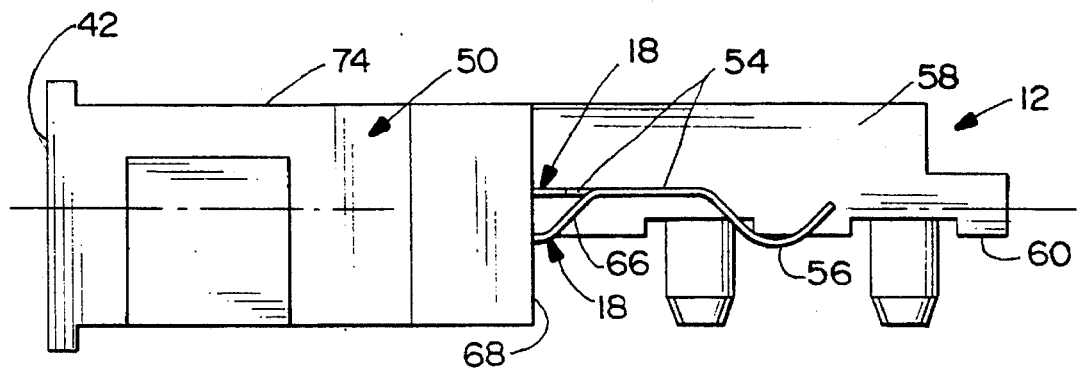
Figure 7C:
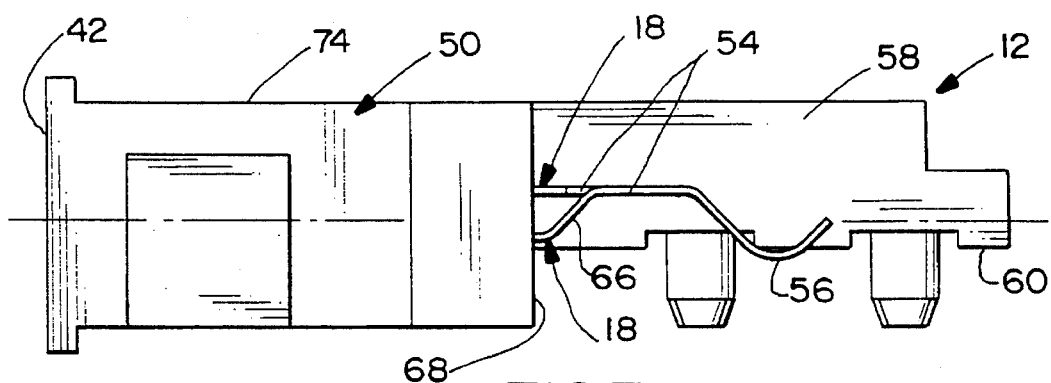

FIGS. 7A–7C clearly illustrate the different "offset" positions of the circuit substrate within the IC card assembly which are to be accommodated by the method of the invention. More particularly, FIG. 7A shows bottom surfaces 60 of wing portions 58 of connector housing 50 located at a given distance from a top surface 74 of the connector housing. This distance represents one "offset" position of the circuit substrate within the IC card assembly. It can be noted that FIG. 7A corresponds to the distances shown in FIGS. 5, 6A and 6B as well as the curvature of contact portions 56 shown in FIG. 6B. FIG. 7B shows bottom surfaces 60 of wing portions 58 at what might be called an intermediate distance representing one another offset position of the circuit substrate within the IC card assembly. FIG. 7C shows still another condition wherein bottom surfaces 60 of wing portions 58 are located still a greater distance from the top 74 of the connector housing. Again, this represents still a further offset position of the circuit substrate within the IC card assembly.

Referring specifically to FIG. 7A, it can be seen that the outside radius of contact portions 56 of surface mount tail portions 54 of terminals 18 is less drastic or more shallow relative to the straight portion of the tail portion than the contact portions 56 in FIGS. 7B or 7C, because the "offset" of the circuit substrate within the IC card assembly, i.e. the location of the substrate from the top of the housing is less in FIG. 7A than in 7B or 7C. The location of contact portions 56 in FIG. 7B can be considered an intermediate offset position of the circuit substrate. The contact portions 56 in FIG. 7C extend the greatest distance below the straight portions of the surface mount tail portions to accommodate an offset position of the circuit substrate relative to the top of the housing which is greater than that of FIGS. 7A and 7B.

Lastly, in all of the depictions of FIGS. 7A–7C, it can be seen that contact portions 56 are formed to project slightly below bottom surfaces 60 of wing portions 58 in the illustrated unstressed condition of the terminals. The terminals may be stamped and formed of sheet metal material which will instill a resiliency in the surface mount tail portions and result in preloading the contact portions so that they are displaced slightly when engaged with surface 22 of circuit substrate 16. This will create a positive normal force of the contact portions on the contact pads of the circuit substrate and ensure that all of the contact portions contact surface 22 of the circuit substrate upon soldering the receptacle connector to the substrate.

In summation, the invention contemplates a method of fabricating receptacle connector 12 for use in IC card assembly 10 wherein the receptacle is mounted generally at edge 28 of circuit substrate 16, and wherein the circuit substrate is located within the card assembly a given distance relative to the top surface of the receptacle housing. Housing 50 of the receptacle connector is also provided with a plurality of terminal-receiving passages 52 in a dual row configuration. A plurality of receptacle terminals 18 are inserted into the two rows of passages with surface mount tail portions 54 of the terminals projecting from the housing in a single row in-line array. The given location of the circuit substrate within the IC card assembly is determined as described above in relation to FIGS. 7A–7B. The straight in-line surface mount tail portions of the terminals are then finally formed into curved contact portions 56 to accommodate the given offset of the circuit substrate within the IC card assembly, such that the contact portions will engage a corresponding single row array of contact pads on the circuit substrate when the receptacle connector is mounted generally at the edge of the circuit substrate.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. A method of fabricating a receptacle connector for use in an IC card wherein the receptacle connector is adapted for mounting generally at an edge of a circuit substrate, comprising the steps of:

providing a receptacle connector housing with a top surface and a plurality of terminal-receiving passages extending parallel thereto, said terminal-receiving passages being configured in a dual row array, wherein the circuit substrate is adapted to be located a given vertical distance from the top surface of the receptacle connector housing;

inserting a plurality of receptacle terminals into both rows of passages, said receptacle terminals having mating portions located within the terminal-receiving passages and surface mount tail portions projecting from both rows of passages and terminating in a single generally straight planar array outside the passages;

determining the given vertical distance between the circuit substrate and the top surface of the receptacle connector housing; and finally forming the planar array of surface mount tail portions in a single forming step to correspond to said given distance such that the surface mount tail portions engage a corresponding single row contact pad array on the edge of the circuit substrate when the receptacle connector is mounted generally thereat.

2. The method of claim 1 wherein said final forming step comprises forming the array of surface mount tail portions such that both rows of receptacle terminals are configured into generally coplanar curved contact portions for engaging the contact pad array of the circuit substrate.

3. The method of claim 1 wherein said mating portions of the receptacle terminals in the upper and lower rows of the terminal-receiving passages are substantially identical and wherein said inserting step includes inserting the receptacle terminals into the upper row of terminal receiving passages in a mirror image configuration with respect to the receptacle terminals inserted in the lower row of the terminal-receiving passages.

4. The method of claim 3 wherein the surface mount tail portions of the receptacle terminals inserted in the bottom row of the terminal-receiving passages include an offset to cause the surface mount tail portions of the bottom row of receptacle terminals to be in-line with the surface mount tail portions of the top row of receptacle terminals thereby defining the single planar array.

5. The method of claim 2 wherein the final forming step further includes simultaneously forming the curved contact portions to project slightly below a substrate-engaging surface of the housing to preload the contact portions and ensure coplanarity thereof.

* * * * *